United States Patent
Patwardhan et al.

(10) Patent No.: US 7,423,337 B1
(45) Date of Patent: Sep. 9, 2008

(54) INTEGRATED CIRCUIT DEVICE PACKAGE HAVING A SUPPORT COATING FOR IMPROVED RELIABILITY DURING TEMPERATURE CYCLING

(75) Inventors: Viraj A. Patwardhan, Sunnyvale, CA (US); Hau Nguyen, San Jose, CA (US); Nikhil K. Kelkar, San Jose, CA (US); Shahram Mostafazadeh, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/707,208

(22) Filed: Nov. 26, 2003

Related U.S. Application Data

(63) Continuation-in-part of application No. 10/224,291, filed on Aug. 19, 2002.

(51) Int. Cl.
*H01L 23/02* (2006.01)
(52) U.S. Cl. .................. 257/686; 257/778; 257/E23.01
(58) Field of Classification Search .................. 257/620, 257/632, 618, 629, 623, 622, 778, 686, E23.01, 257/E23.015, E23.02, E27.113, 666, E23.023
See application file for complete search history.

(56) References Cited

U.S. PATENT DOCUMENTS

| | | |
|---|---|---|
| 5,008,189 A | 4/1991 | Oroskar et al. |
| 5,128,746 A | 7/1992 | Pennisi et al. |
| 5,136,365 A | 8/1992 | Pennisi et al. |
| 5,214,308 A | 5/1993 | Nishiguchi et al. |
| 5,244,143 A | 9/1993 | Ference et al. |
| 5,250,843 A | 10/1993 | Eichelberger |
| 5,329,423 A | 7/1994 | Scholz |
| 5,376,403 A | 12/1994 | Capote et al. |
| 5,495,439 A | 2/1996 | Morihara |
| 5,500,534 A | 3/1996 | Robinson et al. |
| 5,587,342 A | 12/1996 | Lin et al. |
| 5,668,059 A | 9/1997 | Christie et al. |
| 5,698,894 A | 12/1997 | Bryant et al. |
| 5,736,456 A | 4/1998 | Akram |
| 5,767,010 A | 6/1998 | Mis et al. |
| 5,768,290 A | 6/1998 | Akamatsu |
| 5,773,359 A | 6/1998 | Mitchell et al. |
| 5,872,633 A | 2/1999 | Holzapfel et al. |
| 5,880,530 A | 3/1999 | Mashimoto et al. |

(Continued)

OTHER PUBLICATIONS

"All Dressesd Up and Nowhere to Go", Bogatin, Eric, Contributing Editor, May 1, 2002, Semiconductor, Downloaded on Dec. 23, 2003 from http://www.reed-electronics.com/semiconductor/index.asp?layout=article&articleid=CA213812&rid=0&rme=0&cfd=1, 2 pages.

(Continued)

*Primary Examiner*—Howard Weiss
*Assistant Examiner*—Hoa B Trinh
(74) *Attorney, Agent, or Firm*—Beyer Law Group LLP

(57) ABSTRACT

An apparatus and method for increasing integrated circuit device package reliability is disclosed. According to one embodiment of the present invention, a support coating is added to a wafer after solder bumps have been added but prior to dicing. This support coating or underfill layer provides added strength to the eventual reflowed solder connections, such that the operational lifetime of these connections is increased with respect to failure due to temperature cycling.

20 Claims, 5 Drawing Sheets

U.S. PATENT DOCUMENTS

| | | | |
|---|---|---|---|
| 5,895,976 | A | 4/1999 | Morrell et al. |
| 5,925,936 | A | 7/1999 | Yamaji |
| 5,937,320 | A | 8/1999 | Andricacos et al. |
| 5,953,623 | A | 9/1999 | Boyko et al. |
| 5,977,632 | A | 11/1999 | Beddingfield |
| 6,023,094 | A | 2/2000 | Kao et al. |
| 6,060,373 | A | 5/2000 | Saitoh |
| 6,063,647 | A | 5/2000 | Chen et al. |
| 6,071,757 | A | 6/2000 | Fogal et al. |
| 6,100,114 | A | 8/2000 | Milkovich et al. |
| 6,121,689 | A | 9/2000 | Capote et al. |
| 6,130,473 | A | 10/2000 | Mostafazadeh et al. |
| 6,171,887 | B1 | 1/2001 | Yamaji |
| 6,190,940 | B1 | 2/2001 | DeFelice et al. |
| 6,228,678 | B1 * | 5/2001 | Gilleo et al. ............ 438/108 |
| 6,245,595 | B1 | 6/2001 | Nguyen et al. |
| 6,258,626 | B1 | 7/2001 | Wang et al. |
| 6,288,444 | B1 | 9/2001 | Abe et al. |
| 6,297,560 | B1 | 10/2001 | Capote et al. |
| 6,307,269 | B1 | 10/2001 | Akiyama et al. |
| 6,316,528 | B1 | 11/2001 | Iida et al. |
| 6,327,158 | B1 | 12/2001 | Kelkar et al. |
| 6,346,296 | B1 * | 2/2002 | McCarthy et al. ............ 442/66 |
| 6,352,881 | B1 | 3/2002 | Nguyen et al. |
| 6,358,627 | B2 * | 3/2002 | Benenati et al. ............ 428/612 |
| 6,372,547 | B2 | 4/2002 | Nakamura et al. |
| 6,391,683 | B1 | 5/2002 | Chiu et al. |
| 6,429,238 | B1 | 8/2002 | Sumita et al. |
| 6,455,920 | B2 | 9/2002 | Fukasawa et al. ............ 257/620 |
| 6,468,832 | B1 | 10/2002 | Mostafazadeh |
| 6,479,308 | B1 | 11/2002 | Eldridge |
| 6,486,562 | B1 | 11/2002 | Kato |
| 6,507,118 | B1 | 1/2003 | Schueller |
| 6,605,479 | B1 | 8/2003 | Pasadyn et al. |
| 6,649,445 | B1 | 11/2003 | Qi et al. |
| 6,683,379 | B2 | 1/2004 | Haji et al. |
| 6,791,194 | B1 | 9/2004 | Nagai et al. |
| 6,818,550 | B2 | 11/2004 | Shibata |
| 6,822,324 | B2 | 11/2004 | Tao et al. |
| 2002/0003299 | A1 | 1/2002 | Nakamura et al. |
| 2002/0014703 | A1 | 2/2002 | Capote et al. |
| 2002/0027257 | A1 | 3/2002 | Kinsman et al. |
| 2002/0031868 | A1 | 3/2002 | Capote |
| 2002/0109228 | A1 | 8/2002 | Buchwalter et al. |
| 2002/0171152 | A1 | 11/2002 | Miyazaki |
| 2003/0001283 | A1 | 1/2003 | Kumamoto |
| 2003/0013233 | A1 | 1/2003 | Shibata |
| 2003/0080360 | A1 | 5/2003 | Lee et al. |
| 2003/0087475 | A1 | 5/2003 | Sterrett et al. |
| 2003/0099767 | A1 | 5/2003 | Fang |
| 2003/0127502 | A1 | 7/2003 | Alvarez |
| 2003/0129789 | A1 | 7/2003 | Smith et al. |
| 2003/0169064 | A1 | 9/2003 | Pirkle et al. |
| 2003/0193096 | A1 | 10/2003 | Tao et al. |
| 2003/0218258 | A1 | 11/2003 | Charles et al. |
| 2004/0002181 | A1 | 1/2004 | Scheifers et al. |
| 2005/0156331 | A1 | 7/2005 | Akram |
| 2005/0212142 | A1 | 9/2005 | Miyazaki et al. |

OTHER PUBLICATIONS

Kulicke & Soffa, "Polymer Collar WLP™, Wafer Level Package Family" © 2002, 2 pages. http://www.kns.com/prodserv/PDFS/FCD/polymer_collar.pdf.

"Polymer Collar WLP™—A New Wafer Level Package for Improved Solder Joint Reliability", Barrett et al., Kulicke & Soffa—Flip Chip Division, Downloaded from: http://www.kns.com/resources/articles/PolymerCollar.pdf, 9 Pages.

Kulicke & Soffa, "Presenting Polymer Collar WLP™—A New Wafer Level Package for Improved Solder Joint Reliability", © 2002, Downloaded from: http://www.kns.com/prodserv/flipchip/pdf/PC_ad.pdf, 1 page.

Kulicke & Soffa, "Flip Chip Products, Polymer Collar™ Wafer Level Package; Achieve Maximum Reliability for Wafer Level Packages!", Dec. 7, 2001, pp. 1-2 www.kns.com.

Kulicke & Soffa, "Flip Chip Division, Polymer Collar Wafer Level Package; See the Polymer Collar WLP difference!", Dec. 7, 2001, pp. 1-2 www.kns.com.

"Fundamentals of Microsystem Packaging", Rao R. Tummala, Chapters 2, 10, and 17, (May 8, 2001) McGraw-Hill Professional Publishing.

"Chip Scale Package: Design, Materials, Process, Reliability, and Applications", John H. Lau and S.W. Ricky Lee, Chapter 1, pp. 1-41, (Feb. 28, 1999) McGraw-Hill Professional Publishing.

Office Action from U.S. Appl. No. 10/080,913 mailed Mar. 15, 2006.

Office Action from U.S. Appl. No. 10/224,291 mailed Mar. 17, 2006.

Nguyen et al., "Effect of Underfill Fillet Configuration on Flip Chip Package Reliability", SEMI® Technology Symposium: International Electronics Manufacturing Technology (IEMT) Symposium, SEMICON® West 2002.

Office Action mailed Aug. 4, 2005 from U.S. Appl. No. 10/224,291.

* cited by examiner

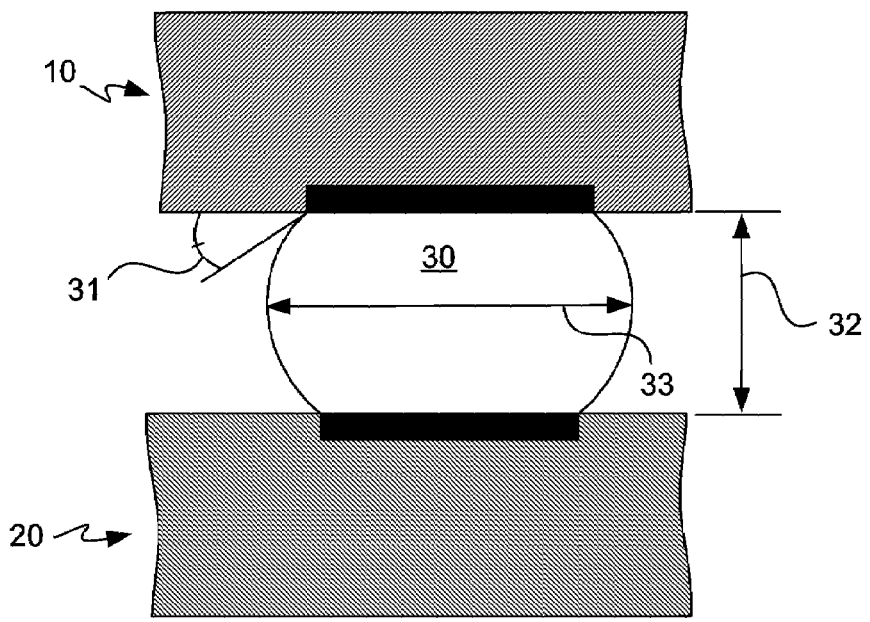
FIG. 3
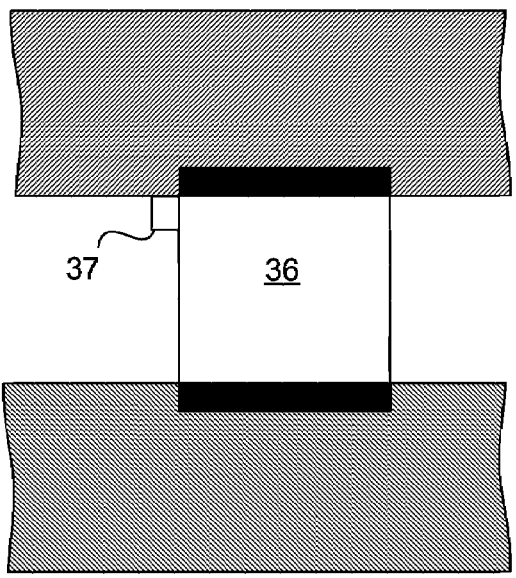 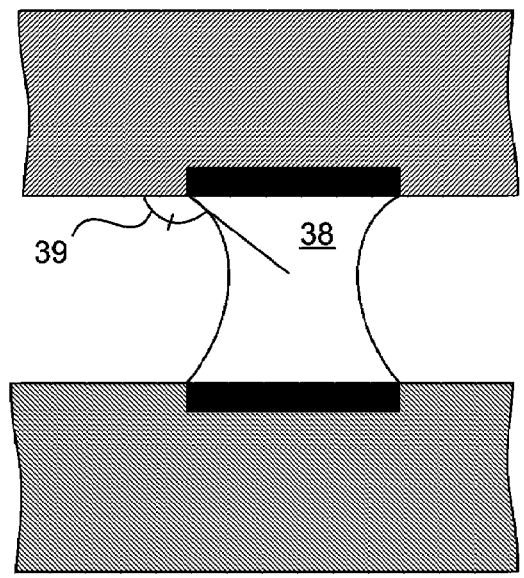
FIG. 4A     FIG. 4B

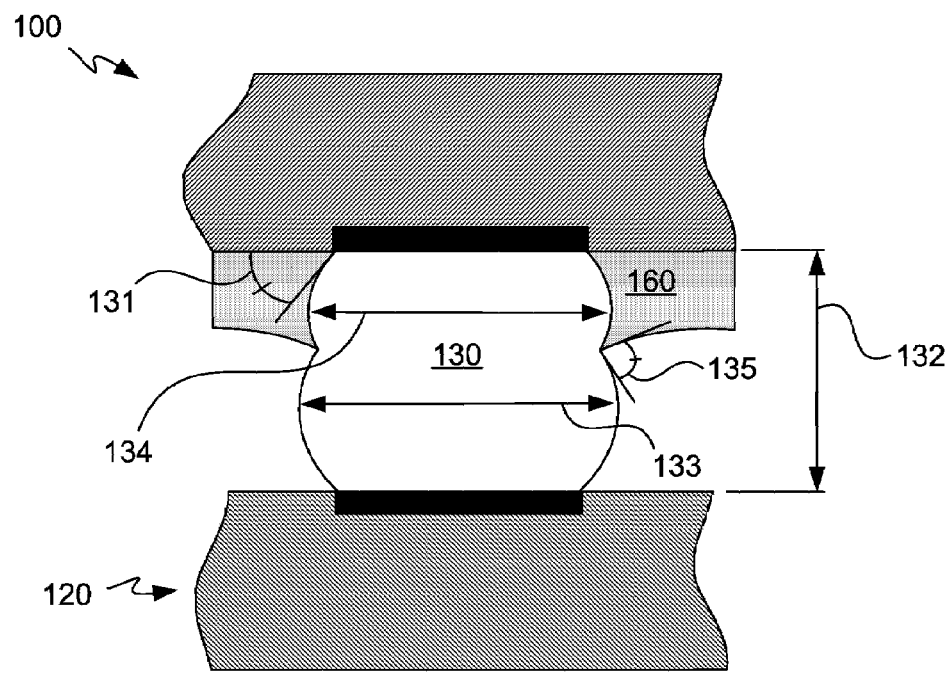
FIG. 6
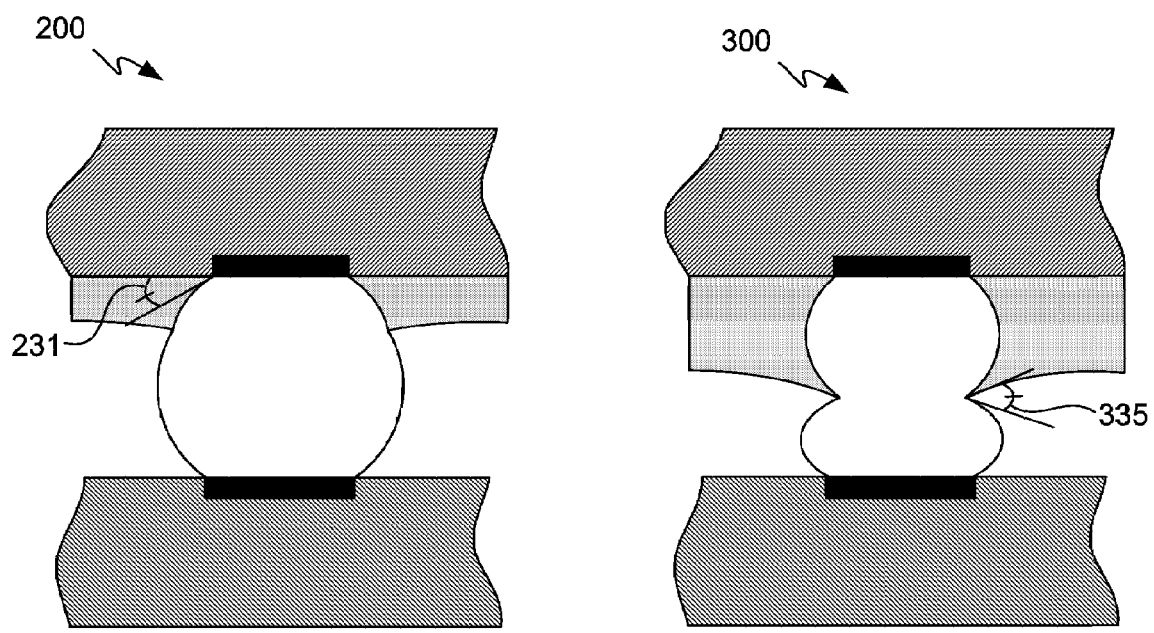
FIG. 7A  FIG. 7B

INTEGRATED CIRCUIT DEVICE PACKAGE HAVING A SUPPORT COATING FOR IMPROVED RELIABILITY DURING TEMPERATURE CYCLING

CROSS REFERENCE TO RELATED APPLICATIONS

The present application is a continuation-in-part of co-pending U.S. patent application Ser. No. 10/224,291, filed Aug. 19, 2002, which is incorporated by reference herein in its entirety and for all purposes.

BACKGROUND

1. Technical Field

The present invention relates generally to "flip chip" style packaging of integrated circuits. More particularly, the invention relates to a support coating that is applied at the wafer level to support solder contacts in flip chip styled packaging.

2. Background

Numerous conventional packages for integrated circuit ("IC") devices involve the formation of solder bumps or other suitable contacts directly on an IC die. The die is then typically attached to a suitable substrate, such as a printed circuit board ("PCB"), such that the solder bumps on the die may be surface mounted onto matching contacts on the substrate. Such surface mount devices are often referred to as "flip chip" devices. In order to reduce the costs of packaging in general, it is generally desirable to perform as many of the packaging steps as possible at the wafer level, before a wafer is diced and separated into individual IC devices.

When packaging surface mount devices, it is common to form the solder bumps directly over the I/O contact pads on the die at the wafer level. Such solder bumps are typically reflowed when the die is subsequently attached (e.g., soldered) to a suitable substrate. During the reflow process, the solder bumps typically collapse to form solder joint connections between the substrate and the attached die. The reliability and lifespan of a typical solder joint can depend on a variety of factors, with one common mode of failure being cracking or shearing due to temperature cycling. Because heat is ordinarily generated whenever an IC device is used, the die, substrate, contact pads, solder joints and other nearby components tend to heat up and expand. Solder, substrates and dice can all have different rates of thermal expansion, such that significant stresses are introduced into a solder joint whenever a significant shift in temperature occurs. When continued use of an IC device results in excessive or high variance temperature cycling, the resulting failure of even one affected solder joint connection can render the entire IC device as unreliable or useless.

It has been observed that the reliability of many reflowed solder joints with respect to this mode of failure is dependent on the wetting angle between the solder joint and the die, as well as the total "standoff" or gap between the substrate and the die. Current attempts to optimize this wetting angle and standoff include defining and controlling various parameters, such as the solder bump size, the amount of solder paste placed on the substrate, and the contact pad size, among others. While many of these techniques do generally help to improve the reliability of reflowed solder joints, there is always a desire to provide even more reliable and more cost effective processes for packaging integrated circuit devices.

SUMMARY

It is an advantage of the present invention to provide an apparatus and method for increasing flip chip package reliability. According to one embodiment of the present invention, a support coating is added to a wafer after solder bumps have been added but prior to dicing. This support coating or layer is arranged so that it constrains the interface between the solder bumps and their associated die contact pads during solder reflow. It has been observed that such a support coating can provide added strength to the eventual reflowed solder joint connections with a substrate, such that the operational lifetime of these solder joints is increased.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF DRAWINGS

The included drawings are for illustrative purposes and serve only to provide examples of possible structures for the disclosed inventive apparatus and method for providing support coating enhanced IC device packages. These drawings in no way limit any changes in form and detail that may be made to the invention by one skilled in the art without departing from the spirit and scope of the invention.

FIG. 3 illustrates in side cross-sectional view a particular solder joint between the substrate and permanently attached semiconductor die of FIG. 2C.

FIG. 4A illustrates in side cross-sectional view a hypothetical solder joint between a substrate and attached semiconductor die.

FIG. 4B illustrates in side cross-sectional view an alternative hypothetical solder joint between a substrate and attached semiconductor die.

FIG. 6 illustrates in side cross-sectional view a particular solder joint between the PCB and permanently attached semiconductor die with a sufficiently rigid support coating of FIG. 5C according to one embodiment of the present invention.

FIG. 7A illustrates in side cross-sectional view an exemplary solder joint between a substrate and a permanently attached semiconductor die having a reduced level of support coating according to one embodiment of the present invention.

FIG. 7B illustrates in side cross-sectional view an alternative exemplary solder joint between a substrate and a permanently attached semiconductor die having an increased level of support coating according to one embodiment of the present invention.

DETAILED DESCRIPTION

Exemplary applications of apparatuses and methods according to the present invention are described in this section. These examples are being provided solely to add context and aid in the understanding of the invention. It will thus be apparent to one skilled in the art that the present invention may be practiced without some or all of these specific details. In other instances, well known process steps have not been described in detail in order to avoid unnecessarily obscuring the present invention. Other applications are possible, such that the following examples should not be taken as limiting.

In the following detailed description, references are made to the accompanying drawings, which form a part of the description and in which are shown, by way of illustration, specific embodiments of the present invention. Although these embodiments are described in sufficient detail to enable one skilled in the art to practice the invention, it is understood that these examples are not limiting; such that other embodiments may be used, and changes may be made without departing from the spirit and scope of the invention.

One advantage of the present invention is the reduction or elimination of reflowed solder joint connection failures due to temperature cycling. This advantage is accomplished at least in part via the improved designs and processes for creating IC device packages disclosed herein, the use of which results in an increased wetting angle and a larger standoff between the silicon die and the substrate to which the die is attached. Such a result is obtainable due to the presence of a support coating that is distributed onto the wafer before the wafer is separated into individual dice.

Figure 1A:
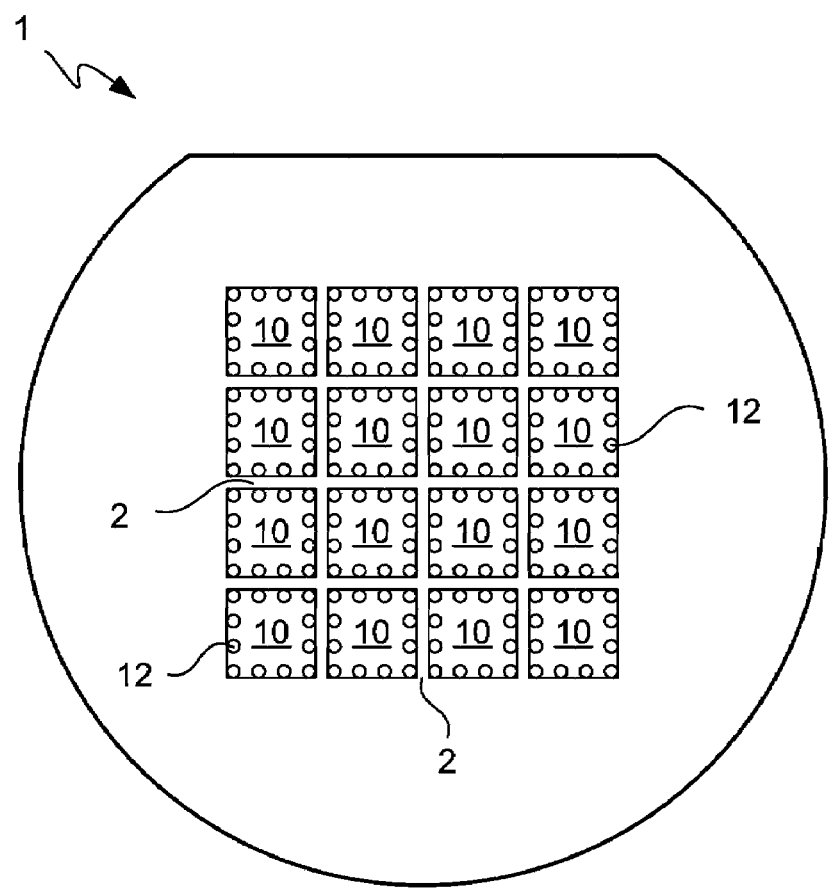
FIG. 1A illustrates in top plan view an exemplary wafer comprising multiple surface mount semiconductor dice.

Referring first to FIG. 1A, an exemplary wafer comprising multiple surface mount semiconductor dice is illustrated in top plan view. Wafer 1 includes a plurality of dice 10 separated by horizontal and vertical scribe lines 2. Each of the dice 10 includes a plurality of solder balls, contacts or "bumps" 12 that are intended to be mounted directly onto contact pads of a substrate, such as a PCB. It should be noted that while only a relatively small number of dice 10 are shown on the wafer 1 for purposes of illustration, most wafers have significantly more dice formed thereon. By way of example, current state of the art wafers typically have several hundred to several thousand dice formed thereon, and some have more than ten thousand dice. As is well known in the art, most wafers and dice are formed of silicon, although any other appropriate semiconductor material can also be used, including, for example, gallium arsenide (GaAs), indium gallium phosphide, silicon germanium, and the like.

Figure 1B:
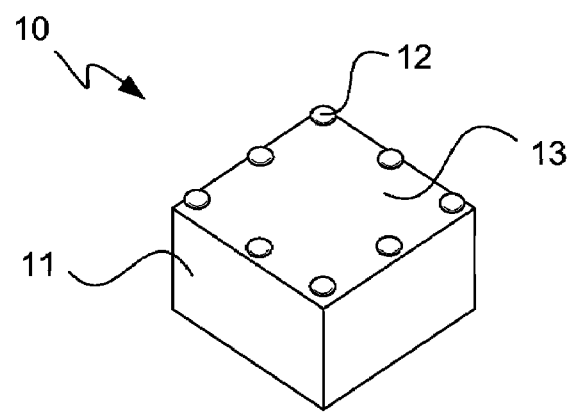
FIG. 1B illustrates in top perspective view a surface mount semiconductor die scribed from the wafer of FIG. 1A.

Referring now to FIG. 1B, an individual semiconductor die 10 scribed from the wafer of FIG. 1A is shown in top perspective view. After the wafer 1 is fabricated and solder contacts or "bumps" 12 are formed thereon, a dicing machine is used to singulate the individual dice 10 by sawing or otherwise cutting the wafer 1 along the scribe lines 2. Each die 10 preferably has a body 11 and a plurality of solder bumps 12 formed on an active face 13. Also, although only one "row" or "ring" of solder contacts or bumps is provided on the die in the illustrated embodiment, other contact patterns including, for example, multiple rows, multiple rings, or arrays of contacts may also be provided as desired. In fact, it is common for solder bumps to be placed into adjacent rows and columns to form a grid or array. Any and all such shapes, dimensions, formations and patterns of solder contacts are contemplated for use with the present invention.

Figure 2A:
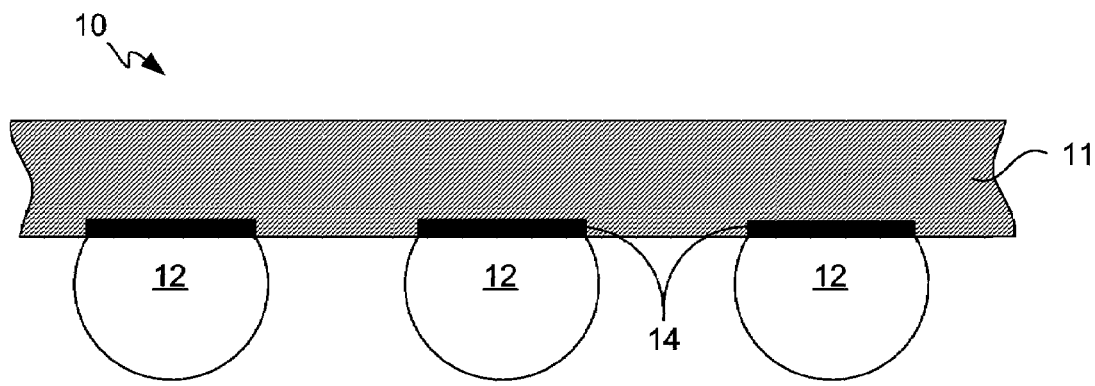
FIG. 2A illustrates in partial side cross-sectional view the semiconductor die of FIG. 1B before attachment to a substrate.
Figure 2B:
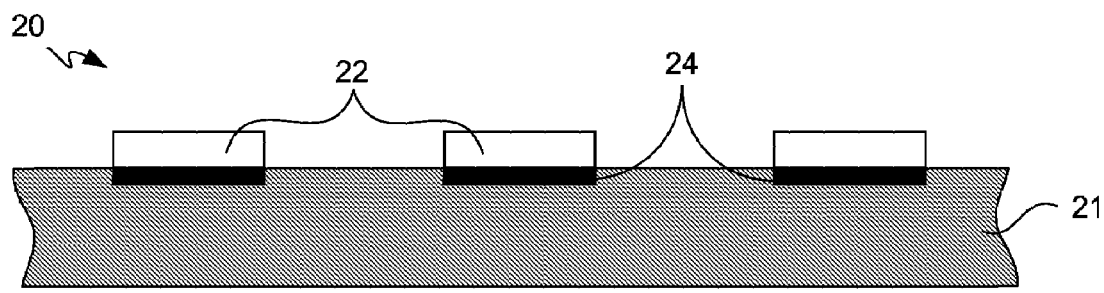
FIG. 2B illustrates in partial side cross-sectional view a substrate before attachment to a semiconductor die.
Figure 2C:
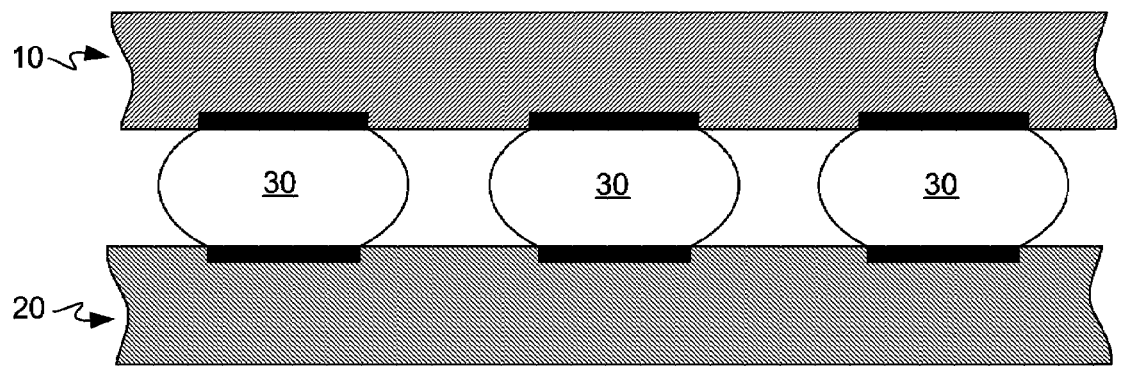
FIG. 2C illustrates in partial side cross-sectional view the semiconductor die of FIG. 2A permanently attached to the substrate of FIG. 2B.

Referring to FIGS. 2A through 2C, various before and after conditions reflecting a permanent attachment of and the formation of solder joint connections between the semiconductor die of FIG. 1B and a substrate are illustrated in partial side cross-sectional view. At a before condition illustrated in FIG. 2A, die 10 is prepared in anticipation of forming solder joint connections with an associated substrate. A number of solder bumps 12 are formed on contact pads 14 or associated contact pad structures, such as under bump metallization stacks, that are located on the active face of the die while the die is still part of the wafer, as will be readily understood by those skilled in the art. At a similar before condition illustrated in FIG. 2B, a substrate 20 is prepared in anticipation of forming solder joint connections with an associated die, such as die 10. Substrate 20 comprises a body 21 upon which a number of contacts 24 are formed. Each contact 24 is preferably covered by a portion of solder paste 22 to aid in the formation of a solder joint connection, although use of such a portion of solder paste is not absolutely necessary. An after condition of the die of FIG. 2A permanently attached to the substrate of FIG. 2B is shown in FIG. 2C. Here, the solder from each side has been heated and reflowed such that solder joint connections 30 are formed.

Continuing on to FIG. 3, a particular solder joint between the substrate and permanently attached semiconductor die of FIG. 2C is similarly illustrated in partial side cross-sectional view. Solder joint 30, which provides an electrical connection and means of communication between the contacts of die 10 and substrate 20, has several important physical features. The wetting angle 31 between the die and solder joint, the final height 32 of the solder joint and the maximum width or diameter 33 of the solder joint are all typically reflective of how much collapse has occurred in the original solder bump during the reflow process, particularly with respect to the values for each of these parameters before reflow. By definition, the final height 32 of the solder joint also represents the standoff distance between the die and the substrate.

As will be readily appreciated by those skilled in the art, the original pre-collapse solder bump dimensions may vary widely from application to application. For purposes of illustration, various after collapse dimensions are given herein for a popular original solder bump size, which can be, for example, on the order of about 300 microns in diameter with an original wetting angle of about 60 degrees. After a typical reflow procedure in a device having solder bumps of such dimensions, the resulting wetting angle 31 for the collapsed solder bumps may be about 25 to 35 degrees, the final solder joint height or standoff 32 may be about 9 mils and the maximum solder bump diameter 33 may be about 360-400 microns. Similar results occur in instances involving different sized solder bumps, with the actual reflowed solder bump dimensions being largely dependent upon the original solder bump size and wetting angle. Although other physical features certainly exist, such as the wetting angle between the substrate and solder joint, the recited physical features for which exemplary dimensions are given here are thought to be most critical with respect to temperature cycling induced failure of the solder joint.

In this regard, it is worth noting that many solder joint failures occur at or near the interface between the solder joint and the die. Tests and observations have shown that not only is it important to have an increased offset between the die and substrate, but also that an increased wetting angle 31 results in a stronger solder joint near its interface with the die. An exemplary technical paper that explains in detail the importance of increasing the wetting angle for this type of packaging application is the one by P. Borgesen, Che Yuli, and H. D. Conway, *IEEE Transactions on Components*, Hybrids &

Manufacturing Technology, Vol. 16, No. 3, May 1993, which technical paper is incorporated herein in its entirety and for all purposes.

Referring now to FIGS. 4A and 4B, two hypothetical solder joints between a substrate and attached semiconductor die are illustrated in side cross-sectional view. In FIG. 4A, the wetting angle 37 of hypothetical solder joint 36 is shown as being 90 degrees, which would theoretically result in a very strong solder joint according to physical modeling calculations and extrapolation of test data. An even better situation is thought to be that which is illustrated in FIG. 4B, where the wetting angle 39 of hypothetical solder joint 38 is greater than 90 degrees. While any mass production of solder joints resembling those in FIGS. 4A and 4B using current semiconductor manufacturing materials and processes is considered to be impractical, methods and techniques for increasing the wetting angle and offset are highly desirable. As described above though, few practices for accomplishing such results are currently known, with those known practices only resulting in incremental increases in offsets and wetting angles.

Figure 5A:
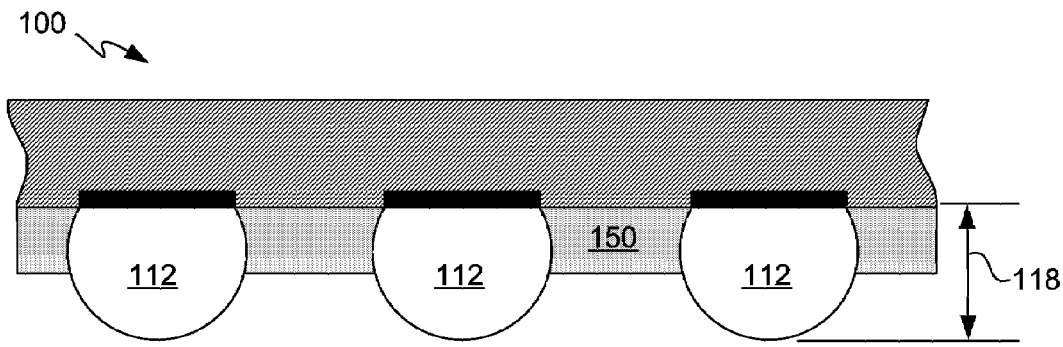
FIG. 5A illustrates in partial side cross-sectional view a semiconductor die having an evenly distributed support coating according to one embodiment of the present invention.

Turning now to FIG. 5A, a semiconductor die having an evenly distributed support coating according to one embodiment of the present invention is illustrated in partial side cross-sectional view. Similar to the foregoing embodiment, die 100 is designed and created such that a number of solder bumps 112 are formed thereon. In addition, a support coating or layer 150 is preferably formed on the active surface of the die 100. At an initial application step, support coating 150 is evenly distributed onto a wafer comprising dice, such as die 100, by any of a number of suitable application methods, such as, for example, screen printing, stencil printing, molding, spin coating, film deposition, vapor deposition, or any other practicable technique. This support coating 150 is preferably applied to the active surface of the wafer such that the support coating substantially covers all of the underlying contact pads, under bump metallizations, and active surface. Although not necessary, in one embodiment this support coating can be applied to the active surface of the wafer while the wafer remains under a controlled environment, such that the underlying contact pads, under bump metallizations, and active silicon (or like material) surface of the wafer are never exposed to ambient air or the environment. After being cured or otherwise rendered sufficiently rigid, this support coating 150 then provides structural support to the solder bumps 112 during any reflow process, as well as to the eventual reflowed solder joints formed by the solder bumps after a reflow process.

It should be appreciated that support coating 150 is not intended to act as an underfill layer. Instead, support coating 150 is an applied layer that is fully cured or otherwise rendered sufficiently rigid after it is applied to the active face of a wafer, but before the wafer is singulated into individual dice. One or more additional layers that function as traditional underfill layers may also be used in conjunction with the present invention if desired, although such underfill layers are not believed to be necessary. Detailed examples and descriptions for adding and using underfill layers in SMT type device applications are disclosed in the commonly assigned and co-pending U.S. patent application Ser. No. 10/224,291 referenced above.

In the described embodiment, support coating 150 is preferably an epoxy-based curable fluid, although other materials than can be rendered sufficiently rigid at the wafer level are also contemplated. By rendering support coating 150 sufficiently rigid at the wafer level, it is intended that this coating be strong enough at this stage such that it can significantly support and constrain portions of the solder bumps near the contact pads during any subsequent reflowing of the solder bumps. While preferable, it is thus not necessary that the applied support coating actually be curable. In fact, while support coatings of this nature would certainly include many types of fully cured epoxies, it is also specifically contemplated that many epoxies at a substantially cured condition may also be used, as well as other fluids that can be applied and rendered sufficiently rigid at the wafer level without a curing procedure.

Figure 5B:
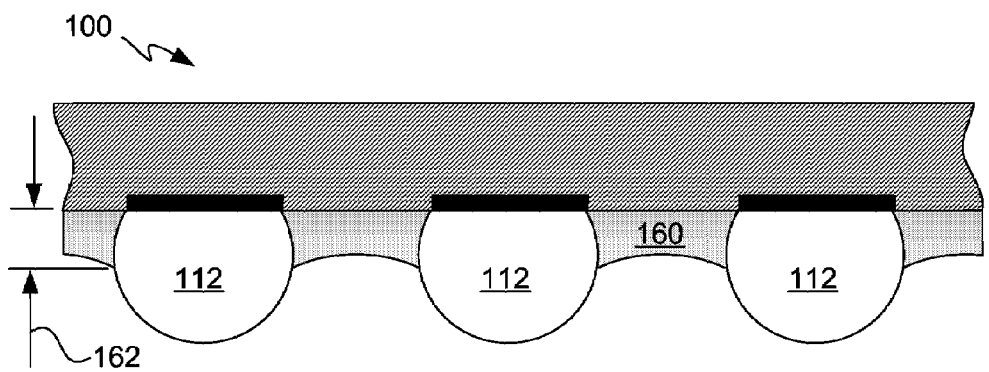
FIG. 5B illustrates in partial side cross-sectional view the semiconductor die of FIG. 5A with a sufficiently rigid support coating according to one embodiment of the present invention.

Referring now to FIG. 5B, the semiconductor die of FIG. 5A having a substantially cured or otherwise sufficiently rigid support coating 160 is shown. Support coating 160 can be quite effective in constraining the extent of collapse by the solder joint, while at the same time being compliant enough to allow successful solder joint formation to occur on the substrate pads. Once the applied support coating 150 is evenly distributed as shown in FIG. 5A, a curing step can then take place, if necessary. Depending on the materials used in the support coating, this curing step may require the support coating to be heated to a particular temperature for a sufficient period of time, or may simply require that an adequate amount of time pass. In any event, it is preferable the support coating be cured or otherwise rendered sufficiently rigid before any die is attached to a substrate. Any necessary curing step thus preferably takes place at the wafer level before the dice are separated therefrom, although it is also possible for the curing of an individual die to take place after the die is singulated but before it is attached to a substrate. As shown in FIG. 5B, support coating 160 may experience some sag in regions that are further away from sharing a surface with another material as a result of any necessary curing procedure, such properties as will be readily understood by those skilled in the art. In addition, a cured support coating may have a height 162 that is shorter than its pre-cured height with respect to where the coating meets each solder bump, depending upon whether any solvent or other like material is used in the coating. In the event that a curing or setting step is not necessary, however, then support coating 160 may be substantially equal to support coating 150.

Figure 5C:
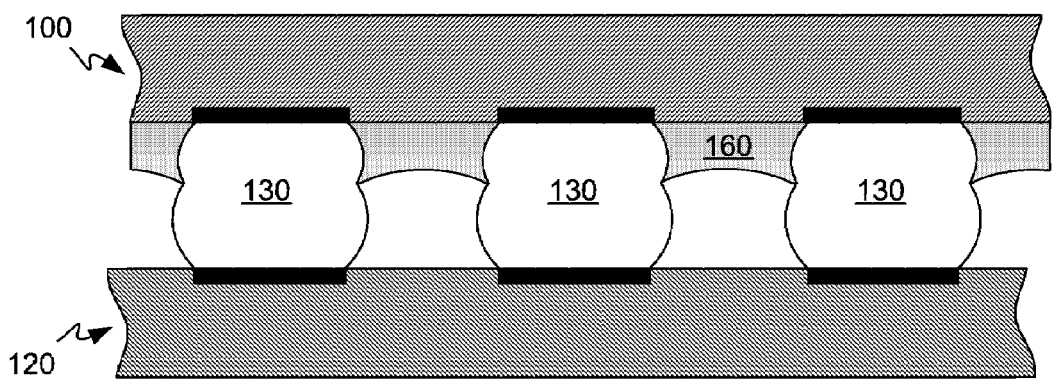
FIG. 5C illustrates in partial side cross-sectional view the semiconductor die with a sufficiently rigid support coating of FIG. 5B permanently attached to a PCB according to one embodiment of the present invention.

Continuing on to FIG. 6, a particular solder joint between the PCB and semiconductor die with a sufficiently rigid support coating of FIG. 5C is similarly illustrated in side cross-sectional view. Compared to the conventional solder joint 30 of FIG. 3, the solder joint 130 of FIG. 6 is superior in several ways. One significant improvement can be found in the wetting angle 131 between the solder joint 130 and tie die 100. If the height of the support coating is at about fifty percent of the original solder bump height, the final wetting angle 131 is typically between 50 and 60 degrees, which is markedly better than the normally resulting angle of about 25 to 35 degrees. In some instances, the final wetting angle 131 is almost equal to the pre-collapse angle between the original solder bump 112 and die 100. In some instances the final wetting angle 131 is at least approximately 40 degrees. In any event, this significant increase in the final wetting angle substantially increases the structural strength of the formed solder joints, which improves solder joint reliability and lifespan under temperature cycling. In fact, preliminary experimental results indicate that reliability and lifespan are at least doubled for solder joints in dice having a sufficiently rigid support coating.

Continuing on to FIG. 6, a particular solder joint between the PCB and semiconductor die with a sufficiently rigid support coating of FIG. 5C is similarly illustrated in side cross-sectional view. Compared to the conventional solder joint 30 of FIG. 3, the solder joint 130 of FIG. 6 is superior in several ways. One significant improvement can be found in the wetting angle 131 between the solder joint 130 and the die 100. If the height of the support coating is at about fifty percent of the original solder bump height, the final wetting angle 131 is typically between 50 and 60 degrees, which is markedly better than the normally resulting angle of about 25 to 35 degrees. In some instances, the final wetting angle 131 is almost equal to the pre-collapse angle between the original solder bump 112 and die 100. In any event, this significant increase in the final wetting angle substantially increases the structural strength of the formed solder joints, which improves solder joint reliability and lifespan under temperature cycling. In fact, preliminary experimental results indicate that reliability and lifespan are at least doubled for solder joints in dice having a sufficiently rigid support coating.

Another improved feature resulting from the use of the support coating is the setoff 132 between the die 100 and PCB 120. Again noting that solder bumps can come in a wide variety of sizes, exemplary dimensions are given herein with respect to an illustrative example involving solder bumps having an original pre-flow diameter of about 300 microns. In such an instance, the setoff after reflow for solder bumps with an original diameter of about 300 microns ranges from about 12 to 12.5 mils for the solder joint 130 shown in FIG. 6, as opposed to the 9 mils that results in a typical solder joint 30 involving a collapsed 300 micron solder bump shown in FIG. 3. Other dimensions include the maximum widths of the solder joint 130, which are about 340-380 microns for the lower width 133, and about 305-335 microns for the upper width 134, both of which are improvements over the maximum width of about 360-400 microns for the more collapsed solder joint 30. Each of these improved features and dimensions results in a solder joint that is significantly stronger and more durable than solder joints that are formed in devices without a sufficiently rigid support coating.

It should be noted, however, that the height of the support layer relative to the solder bump and the amount of solder paste used on the substrate must be reasonably controlled to have the best results. It should be appreciated that the somewhat "snowman" like shape to the solder joint 130 illustrated in FIG. 6 results in an additional mid-level wetting angle 135. Although this angle is fairly large and thus inconsequential as illustrated in FIG. 6, variances in the height of the original support coating and the volume of any solder paste used can affect this angle greatly. Turning now to FIGS. 7A and 7B, exemplary solder joints between substrates and attached semiconductor dice having support coatings of varying heights are illustrated. FIG. 7A shows a die-solder joint-substrate combination 200 that typically results when a support coating having a height of less than about 20 percent of the overall solder bump height is formed on the active surface of the wafer. As can be seen, the resulting solder joint is substantially similar to the solder joint 30 of FIG. 3. Very little solder bump collapse has been prevented, and the solder joint to die wetting angle 231 is almost the same as the wetting angle found in FIG. 3. Also notable is that the mid-level angle is quite large, such that it is of no significant consequence.

Conversely, FIG. 7B shows a die-solder joint-substrate combination 300 that typically results when a support coating having a height of greater than about 70 percent of the overall solder bump height is formed on the active surface of the wafer. As can be seen, the "snowman" like shape of the solder joint is even more exaggerated in this example. This result is favorable in that almost all solder bump collapse near the die has been prevented, such that the solder joint to die wetting angle is virtually the same as the wetting angle prior to reflow. Unfortunately, the mid-level angle 335 has been reduced substantially, such that it now becomes the primary location for solder joint cracking and shearing due to temperature cycle failure. It thus becomes apparent that any advantageous use of a support coating to strengthen the solder joint connections must strike a balance between optimizing the solder joint to die wetting angle and optimizing the mid-level angle corresponding to the height of the support coating.

Experimentation has determined that final heights for the support coating that go lower than about 20 percent and higher than about 70 percent of the original solder bump height result in solder joints that tend to be progressively weaker as the percentage extends from this range. Experimentation has also shown that the benefits of adding such an epoxy-based support coating outweigh the burdens involved in adding more materials and process steps when the solder joints are significantly strengthened and made to be more reliable. Such results certainly occur when the final height of the support coating falls between about 20 percent and about 70 percent of the original solder bump height. More preferably, the final height of the support coating should be at about 40 to 60 percent of the original height of the solder bumps, and even more preferably, the support coating height should be at about 48 to 52 percent of the original height of the solder bumps. It is thought that the ideal final height of the support coating is about 50 percent of the original solder bump height.

With respect to the composition that should be used for the support coating discussed herein, a curable dielectric fluid comprising an epoxy or other hard resin type base is preferred. Any other material or composition can be used, however, provided that such a material or composition can be cured or otherwise rendered sufficiently rigid such that it will not significantly transform further during any solder reflow or IC device operating conditions. The support coating is preferably clear, although dye may be added to help block visible light and thereby reduce photo induced leakage currents. By way of example, an epoxy-based support coating having a coefficient of thermal expansion ("CTE") in the range of approximately $20\times10^{-6}$/K to approximately $30\times10^{-6}$/K@ 25° C., has been found to work well in order to assist in the reduction of thermally induced stresses, since the CTE for most solders is also in this range.

In one embodiment, an epoxy-based fluid having a 50-60 percent solvent content by weight is used, since the use of solvent results in a fluid that is easier to distribute evenly. Solvent is added mainly to control the viscosity of the formulation and more readily allow an even application of the support coating. Experimental use of a support coating material having the above-defined characteristics has shown that much of the solvent tends to evaporate during a curing process. Thus, the initial height of the support coating as applied to the active surface of the wafer may need to take into account the reduction in thickness due to solvent loss. In one example using a curable support coating having a 50 percent solvent content by weight, it has been found that in order to produce a fully cured support coating having a height of about 50 percent of the height of the solder bumps, the pre-curing thickness of the material should be approximately 100 percent of the height of the solder bumps. In various other embodiments of the invention, a support coating having a lower solvent content may be used. With the solvent content lower, the amount of solvent loss will be less. Therefore, the height of the pre-cured support coating needs to be selected such that the height of the fully cured support coating is at the desired level.

Although the foregoing invention has been described in detail by way of illustration and example for purposes of clarity and understanding, it will be recognized that the above described invention may be embodied in numerous other specific variations and embodiments without departing from the spirit or essential characteristics of the invention. Certain changes and modifications may be practiced, and it is understood that the invention is not to be limited by the foregoing details, but rather is to be defined by the scope of the appended claims.

The invention claimed is:

1. A singulated integrated circuit die, comprising:
   an active surface;
   a plurality of substantially spherical solder bumps formed on the active surface of said die such that base junctions between said solder bumps and their associated surfaces of formation define first wetting angles, wherein each of said substantially spherical solder bumps is formed from a single homogenous material; and
   a single support coating formed on said active surface of said die such that mid-level wetting angles are formed at mid-level junctions where the upper surface of said single support coating meets said solder bumps, wherein said single support coating has been fully cured prior to any reflow of said plurality of solder bumps, wherein the height of said single support coating is from about 20 percent to about 70 percent of the pre-reflow height of said solder bumps, wherein said single support coating and said solder bumps are arranged such that when the solder bumps are reflowed as part of a soldering operation to secure said singulated integrated circuit die to a support, the resulting mid-level wetting angles remain sufficiently high such that said mid-level junctions do not become the primary location for solder joint failure, and the resulting first wetting angles are at least approximately 50 degrees, and wherein said single support coating consists of the only coating formed on said active surface of said singulated integrated circuit die.

2. The singulated integrated circuit die of claim 1, wherein said support coating is formed from an epoxy based material.

3. The singulated integrated circuit die of claim 1, wherein the height of said support coating is about 40 to 60 percent of the pre-reflow height of said solder bumps.

4. The singulated integrated circuit die of claim 3, wherein the height of said support coating is about 48 to 52 percent of the pre-reflow height of said solder bumps.

5. The singulated integrated circuit die of claim 1, wherein said support coating is applied to the active surface such that a plurality of underlying contact pads, under bump metallizations, and the active surface are all substantially covered by the support coating.

6. An integrated circuit device, comprising:
   a die having an active surface and a plurality of die contact pads formed on the active surface of the die;
   a plurality of solder bumps coupled with associated die contact pads, wherein each of said solder bumps is formed from a single homogenous material; and
   a support coating formed on said active surface of said die, wherein said support coating is sufficiently rigid such that it is suitable for significantly constraining portions of the solder bumps near the bump to die interfaces during a subsequent reflow of said plurality of solder bumps, and wherein the height of said support coating is from about 20 percent to about 70 percent of the pre-reflow height of said solder bumps.

7. A system comprising:
   the integrated circuit device of claim 6; and
   a substrate having a plurality of substrate contact pads, wherein said integrated circuit device has been coupled with one or more substrate contact pads to form one or more solder joints, and wherein the junction between at least one of said one or more solder joints and its associated die contact pad defines a wetting angle that is at least approximately 40 degrees.

8. The system of claim 7, wherein the offset distance between said die and said substrate is at least 12 mils.

9. The system of claim 7, wherein the maximum solder joint width is less than 115 percent of the maximum width of the corresponding solder bump prior to reflow.

10. The integrated circuit device of claim 6, wherein said support coating has been fully cured prior to any reflow of any of said plurality of solder bumps.

11. A semiconductor wafer, comprising:
    a multiplicity of integrated circuit devices as recited in claim 6.

12. A semiconductor wafer as recited in claim 11, wherein the height of said support coating is about 50 percent of the pre-reflow height of said solder bumps.

13. A semiconductor wafer as recited in claim 11, wherein the junction between the solder bumps and their associated contact pads define wetting angles that are at least approximately 40 degrees.

14. The integrated circuit device of claim 4, wherein the height of said support coating is about 50 percent of the pre-reflow height of said solder bumps.

15. The integrated circuit device of claim 1, wherein said support coating is formed such that a reflow of said solder bumps results in first wetting angles and mid-level wetting angles that are greater than about 50 degrees.

16. The integrated circuit device of claim 14, wherein said support coating is formed such that a reflow of said solder bumps results in first wetting angles and mid-level wetting angles that are equal to or greater than about 60 degrees.

17. A semiconductor wafer having an active wafer surface, the wafer comprising:
    a multiplicity of integrated circuit devices as recited in claim 1.

18. A semiconductor wafer as recited in claim 17, wherein said support coating is applied to the active wafer surface such that a plurality of underlying contact pads, under bump metallizations, and the active wafer surface are all substantially covered by the support coating.

19. A semiconductor wafer as recited in claim 17, wherein the height of said support coating is about 50 percent of the pre-reflow height of said solder bumps.

20. An integrated circuit device, comprising:
    a die having an active surface;
    a plurality of solder bumps formed on the active surface of said die such that base junctions between said solder bumps and their associated surfaces of formation define first wetting angles, wherein each of said solder bumps is formed from a single homogenous material; and
    a support coating formed on said active surface of said die such that mid-level wetting angles are formed at mid-level junctions where the upper surface of said support coating meets said solder bumps, wherein said support coating has been fully cured prior to any reflow of said plurality of solder bumps, wherein the height of said support coating is from about 20 percent to about 70 percent of the pre-reflow height of said solder bumps, and wherein said support coating and solder bumps are arranged such that when the solder bumps are reflowed as part of a soldering operation to secure said integrated circuit device to a support, the resulting first wetting angles are at least approximately 40 degrees.

* * * * *

UNITED STATES PATENT AND TRADEMARK OFFICE
CERTIFICATE OF CORRECTION

PATENT NO. : 7,423,337 B1
APPLICATION NO. : 10/707208
DATED : September 9, 2008
INVENTOR(S) : Patwardhan et al.

It is certified that error appears in the above-identified patent and that said Letters Patent is hereby corrected as shown below:

In the Face of the Patent:

(75) Inventors: Change "Nikhil K. Kelhar" to --Nikhil V. Kelhar--.

In the Specification:

Column 6, after line 39, insert --Referring to FIG. 5C, the semiconductor die of FIG. 5B is shown as being permanently attached to a substrate, such as PCB 120, in accordance with one embodiment of the present invention. As illustrated, a single die 100 has been aligned with contacts on a PCB 120 and permanently attached through the reflowing of the solder bumps of the die and the solder paste of the PCB to form multiple solder joint connections 130. Because of the presence of the sufficiently rigid support coating 160, however, the shape of each solder joint 130 is substantially constrained in comparison with a typical solder joint 30, as seen in FIGS. 2C and 3. As indicated above, the support coating 160 has provided structural support to the solder bumps 112 during the reflow process, such that the extent of the collapse of the solder joints has been constrained. In addition, the support coating 160 is also able to provide structural support to the subsequent solder joint connections 130.--.

Col. 6, line 46, delete "tie".

Col. 6, beginning at line 62 and ending with Col. 7, line 14, delete "Continuing on to FIG. 6, a particular solder joint between the PCB and semiconductor die with a sufficiently rigid support coating of FIG. 5C is similarly illustrated in side cross-sectional view. Compared to the conventional solder joint 30 of FIG. 3, the solder joint 130 of FIG. 6 is superior in several ways. One significant improvement can be

UNITED STATES PATENT AND TRADEMARK OFFICE
CERTIFICATE OF CORRECTION

PATENT NO. : 7,423,337 B1
APPLICATION NO. : 10/707208
DATED : September 9, 2008
INVENTOR(S) : Patwardhan et al.

It is certified that error appears in the above-identified patent and that said Letters Patent is hereby corrected as shown below:

found in the wetting angle 131 between the solder joint 130 and the die 100. If the height of the support coating is at about fifty percent of the original solder bump height, the final wetting angle 131 is typically between 50 and 60 degrees, which is markedly better than the normally resulting angle of about 25 to 35 degrees. In some instances, the final wetting angle 131 is almost equal to the pre-collapse angle between the original solder bump 112 and die 100. In any event, this significant increase in the final wetting angle substantially increases the structural strength of the formed solder joints, which improves solder joint reliability and lifespan under temperature cycling. In fact, preliminary experimental results indicate that reliability and lifespan are at least doubled for solder joints in dice having a sufficiently rigid support coating."

Signed and Sealed this

Twenty-fifth Day of November, 2008

JON W. DUDAS
*Director of the United States Patent and Trademark Office*